United States Patent [19]

Gentry

[11] Patent Number: 5,673,199
[45] Date of Patent: Sep. 30, 1997

[54] COMPUTER AIDED REUSE TOOL

[75] Inventor: Roy M. Gentry, Manhattan Beach, Calif.

[73] Assignee: Hughes Electronics, Los Angeles, Calif.

[21] Appl. No.: 431,602

[22] Filed: May 1, 1995

[51] Int. Cl.$^6$ ............................................. G06F 17/50
[52] U.S. Cl. ........................ 364/490; 364/488; 364/489; 364/578
[58] Field of Search ........................ 364/488, 489, 364/490, 491, 578; 382/240

[56] References Cited

U.S. PATENT DOCUMENTS

| | | | |
|---|---|---|---|
| 5,402,358 | 3/1995 | Smith et al. | 364/490 |
| 5,452,238 | 9/1995 | Kramer et al. | 364/578 |
| 5,519,628 | 5/1996 | Russell et al. | 364/489 |
| 5,519,630 | 5/1996 | Nishiyama et al. | 364/490 |
| 5,533,148 | 7/1996 | Sayah et al. | 382/240 |

Primary Examiner—Kevin J. Teska
Assistant Examiner—Russell W. Frejd
Attorney, Agent, or Firm—Gordon R. Lindeen, III; Michael W. Sales; Wanda K. Denson-Low

[57] ABSTRACT

A computer aided system design tool which enables the user to define the system functionally by defining functional program requirements (28) and defining preliminary system requirements (30). After the program requirements (28) and preliminary system requirements (30) have been defined, an automated reuse tool (38) selects particular implementations for each of the functions specified by the user when defining the functional program requirements (28). The automated reuse tool (38) also partitions the system constrains defined by the preliminary system requirements (30) over the system by proper selection of particular implementations for each design. The resulting reuse design database (40) may then be simulated (42) to verify proper operation of the system.

20 Claims, 5 Drawing Sheets

COMPUTER AIDED REUSE TOOL

STATEMENT OF GOVERNMENT SUPPORT

This invention was made with government support under grant #865 awarded by the Charles Stark Draper Labs (CSDL) and government contract #DL-454824. The government has certain rights in the invention.

BACKGROUND OF THE INVENTION

1. Field of Invention

This invention relates generally to a computer aided system development tool for designing both simple and complex systems and, more particularly, to a method and apparatus for defining and assembling systems using functional operations which are uniquely linked to define the system and enable testing by the system.

2. Discussion

The proliferation of increasingly more powerful, yet inexpensive computers has made their use much more attractive in almost every possible industry. One particular area in which computer usage has significantly increased is in the area of design and testing any of a number of possible systems. In the system design and testing fields, system engineers and designers use computers to both model the system and in some fields to generate computer code or pseudo-code to control devices which implement the system or to direct the manufacturing of the devices to implement the system.

In the typical development cycle, a system engineer or designer receives program requirements which generally describe the desired outputs of the system as a function of the available inputs as well as system constraints such as maximum system weight, for example. These program requirements form the basis for the systems engineering or design (referred to hereafter as system engineering) process where functions which operate on the inputs to provide outputs are further refined in light of the constraints to more specifically define the system. After the functions have been determined by the systems engineer, the system engineer then focuses on the design implementation. That is, the engineer actually implements the various system functions by designing or selecting existing implementations for carrying out a particular function or operation. The systems engineer then commences the verification process. Typically the selection of specific implementations and verification of the system as a whole is referred to as a design and verification process. This design and verification process often involves computer aided engineering (CAE) tools, as well as computer aided software engineering (CASE) tools. The design and verification stage provides initial information on the operation of the system.

To obtain an improved indication of the operation of the system, system engineers fabricate and bench test the verified system in order to yield more accurate and robust information on the design. Bench testing often provides more accurate information because the bench-tested system generally more closely approximates the final design. Following fabrication and bench testing, the system is actually built, including fabricating the actual hardware and providing the necessary software to insure proper integration of the system.

Systems engineers often reuse designs generated and tested as part of one system in other, related systems. To provide a more efficient overall design process, systems engineers often create a database of the designs making up one system so that these designs are available for use in other systems. This may significantly reduce the overall system design cycle-time because functionality which is used repeatedly need not be redesigned each time this functionality is required for a different system.

A significant disadvantage of this current development cycle is that while designs are saved in the design databases, specific, detailed information on how to reuse the designs stored in the design database is not generally stored in the design database. Further, systems are stored as monolithic structures rather than separable functions that could be shared by many systems. This results in inefficient use of the design database because the reused design structures are quite often not reused in their entirety, and only a portion of the design may be extricated from the entire design structure. In this manner, the design process becomes less efficient because the entirety of the design is not reused, and the portion of the design extracted from the complete design structure usually requires additional design or redesign to adapt it to the specific use.

In addition, because systems engineers tend to model systems by structure, the current development cycle also tends to restrict reuse because a particular design may not be easily and completely shared by more than one system. Further, because designs are stored in design databases in their entirety and are not partitioned in accordance with the design to be carried out and specific operating parameters related to the design, reuse of the design is further limited. Storing the design structure in its entirety, rather than separating the design structure into its component functions each with parameters controlling its operation, exacerbates the existing inefficiencies in the reuse design process.

Thus, it is desirable to provide a computer aided reuse tool in which designs may be stored in terms of their operations and the operating parameters of each function tailor its specific operation. It is further desirable to more efficiently use the functions stored in the design database by relying initially on merely the operational component of the system requirements to enable initial modeling of the system, then incorporating the system constraints to differentiate between the various implementations associated with each function and make selections to optimize the developed system.

SUMMARY OF THE INVENTION

This invention relates to a method and apparatus for developing a predefined target system by combining a plurality of selected functions which define the target system. The target system to be designed includes a functional description which describes the operation of the system and system constraints which define the non-functional requirements of the system.

The system includes memory for storing a plurality of designs for carrying out specified operations, where each design is executable in at least one implementation. Each design of the plurality is a candidate for selection and combination with a selected other design of the plurality to yield a predetermined functional result. The system also includes an apparatus for combining selected designs of the plurality stored in memory to substantially satisfy the functional description of the target system. Once the functional description of the target system is satisfied, an apparatus automatically selects particular implementations of each selected design so that the system constraints are partitioned over the selected implementations to substantially satisfy the system constraints of the target system.

The various advantages of the present invention will become apparent to one skilled in the art by reading the following specification and by reference to the following drawing in which:

BRIEF DESCRIPTION OF THE DRAWINGS

The various advantages of the present invention will become apparent to one skilled in the art by reading the following specification and by reference to the following drawings in which.

DETAILED DESCRIPTION OF THE PREFERRED EMBODIMENTS

The following description of the preferred embodiments is merely exemplary in nature and not intended to limit the invention or its application or uses. In this specification, note that elements having similar structures or functions will be referred to using like reference numerals.

Figure 1:
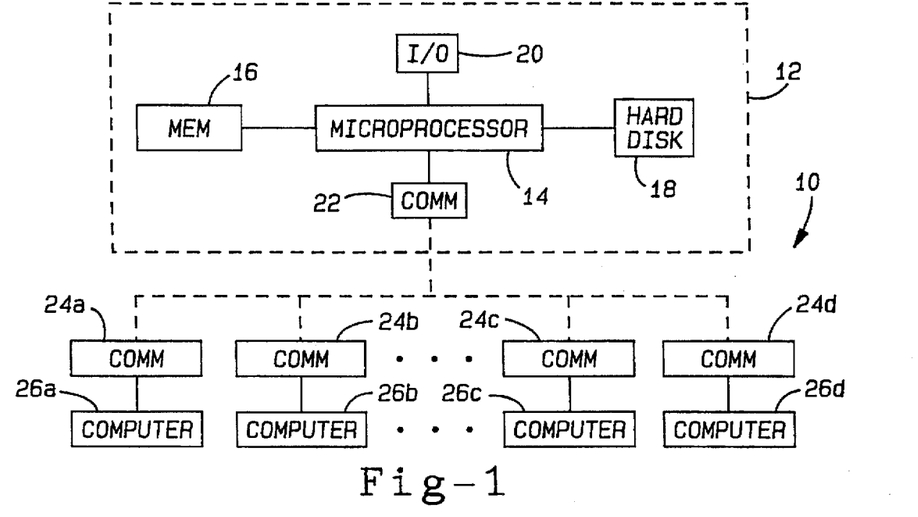
FIG. 1. is a block diagram of a computer system for implementing the computer aided reuse tool according to the principals of the present invention.

Referring to FIG. 1, the computer aided reuse (CAR) system 10 will be generally described with respect to implementation on a computer 12. Computer 12 includes a microprocessor 14 which directs operation of the computer 12 and controls input and output to computer 12 as well. Microprocessor 12 includes a memory 16 which may be either external or internal to microprocessor 14 and communicates with microprocessor 14 via a data bus, as will be understood by one skilled in the art. A mass storage device, such as hard disk 18 stores various data and programs for retrieval by microprocessor 14 and communicates with microprocessor 14 via a data bus, as is also well known to those skilled in the art. Input/output units (I/O) 20 typically provide a medium for inputting and outputting data to microprocessor 14. I/O unit 20 generally includes a keyboard and a display and may also include a mouse or other pointing device, a printer, and/or any of a number of well known input/output devices as is commonly used in the computer arts.

Because computer 12 may desirably communicate with other computers, computer 12 also includes a communication interface 22. Communication interface 22 generally enables computer 12 to send and receive data to and from one or a number of other computers to enable network processing, multi-computer simulations, and/or parallel processing. Communication interface 22 typically communicates by providing output in the form of digital and/or analog signals. One or a plurality of communication interfaces 24a, 24b, 24c, and 24d may optionally communicate with communication interface 22. Communication interfaces 24a, 24b, 24c, and 24d typically connect to remote computers 26a, 26b, 26c, and 26d respectively. Remote computer 26a, 26b, 26c, and 26d are arranged similarly to and operate similarly to computer 12 described above.

Figure 2:
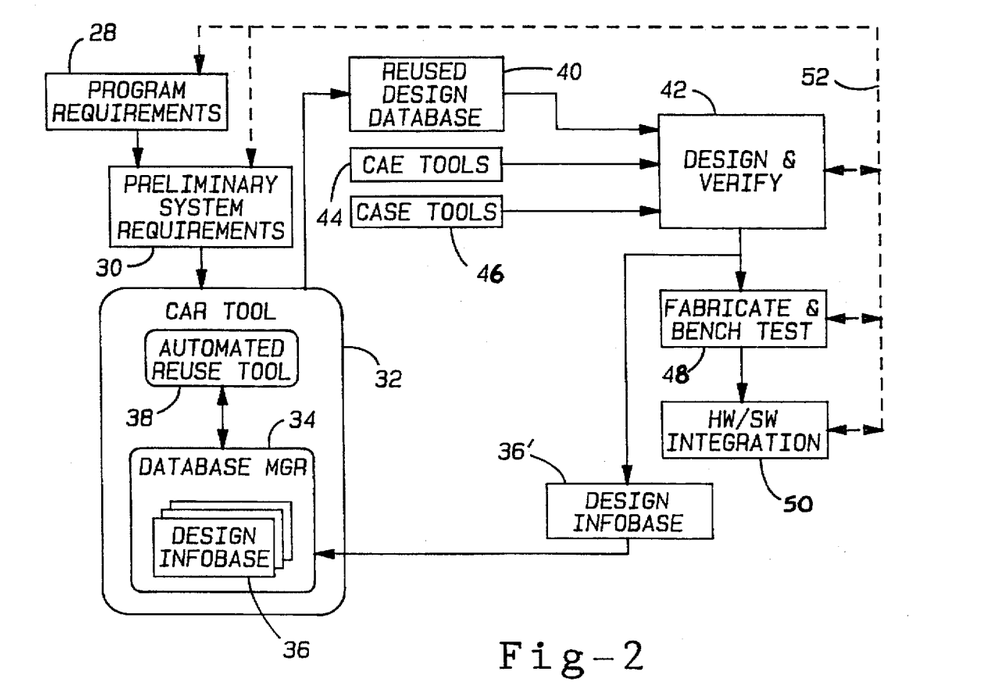
FIG. 2 is a flow diagram of a development cycle which makes use of the computer aided reuse tool and may be implemented on the computer system of FIG. 1.

The CAR System 10 shown in FIG. 1 provides the necessary tools which enable a system designer to progress from initial program requirements to an integrated system by carrying out the predetermined functions defined at least in part by the initial program requirements. FIG. 2 is a flow diagram of the development process typically followed by the system engineer to develop, test, and integrate program requirements into an operational system using the computer aided reuse tool. The system designer first determines program functional requirements as shown at block 28. Program requirements are typically broad statements of how the system generally should operate and what its constraints are, the inputs, the desired operations performed using the inputs, and the desired outputs. Such requirements may be generated through flow diagrams to graphically define the system.

After broadly determining the program requirements, the system engineer then formulates preliminary system requirements 30 which further define the system by specifying the initial program requirements in greater detail, including better defining the inputs, the functions to be operated on the inputs, and the desired outputs. After having formulated preliminary system requirements, the system engineer then selects functions stored by the computer aided reuse (CAR) tool 32 and selects parameter values for each function which better defines the functions so as to generally meet the preliminary system requirements as defined in preliminary system requirements block 30. The computer aided reuse tool, to be described further in detail herein, generally includes a database manager 34. The database manager 34 is operable to manage the design infobase 36. Design infobase 36 includes a prestored library of previously formulated, available functions available for adaptation and usage in the system under design to carry out the preliminary system requirements specified at block 30.

The CAR tool 32 includes an automated reuse tool 38. Automated reuse tool 38 interfaces with design infobase 36 via database manager 34. Once the system engineer has selected from the available prestored functions, the automated reuse tool 38 selects from design infobase 36 via database manager 34 from the available selection of predetermined, prestored functions implementation associated with each function which best meets one or a number of the preliminary system requirements defined in block 30. After automated reuse tool 38 of CAR tool 32 has selected implementations for each function selected by the system engineer from the library of available functions and associated implementations, the selected functions and their automatically selected implementations are output to reused design database 40. Reused design database 40 stores the functions selected by the system engineer and the implementations selected by automated reuse tool 38.

After having selected a reused design database 40, the system engineer then proceeds to the design and verify portion of the development process as depicted by design and verify block 42. In the design and verify block 42, the design engineer performs detailed simulations and analyses of the implementations selected by the computer aided reuse tool 38. At the design and verify stage 42, the design engineer also has access to computer aided engineering (CAE) tools 44 and computer aided software engineering (CASE) tools 46. Because every requirement specified in preliminary systems requirement block 30 may not be stored in design infobase 36, the design engineer may be required to design functions which could not be found in design infobase 36. Such would be done during the design and verify stage 42. CAE tools 44 and CASE tools 46 provide the design engineer with resources to design functions not found in design infobase 36 or to design specified functions to replace those functions selected which meet preliminary system requirements 30 but do not fully meet the design engineer's expectations. In electrical and electronic systems development, CAE tools may include Simulation Program with Integrated Circuit Emphasis (SPICE) tools, Very High Speed Integrated Circuit (VHISIC) Hardware Description Language (VHDL) tools, thermal analysis, signal integrity analysis tools, and static timing analysis tools. Case tools 46 typically include any of a variety of software engineering development tools, such as object oriented design tools, language translators, and/or software frameworks. Also during the design and verify stage 42, the systems engineer may design specific implementations to add to those functions found in reused design database 40. These implementations will be later stored in the design infobase 36 in connection with the function for which a particular implementation is developed.

Any selected implementations of functions already stored in design infobase 36 or any functions designed during the design and verify phase 42 and their associated implementations are output to design infobase 36'. The design infobase 36' is then stored by database manager 34' for possible future analysis of the system described by the design infobase 36'. Also the database manager 34' stores any functions which were newly generated to complete design infobase 36'. By incorporating these newly generated functions as separate entities they become available for future system developments. Also following design and verify phase 42, the design engineer fabricates and bench tests the verified design, as shown at fabricate and bench test block 44. In this phase, the design engineer typically builds the system or a hardware model of the system and tests the system. The fabricate and bench test phase 44 provides a more approximate prototype than the modeling and testing performed at design and verify stage 42. If the design engineer is satisfied with the results during the fabricate and bench test phase 46, the development process then proceeds to hardware/software (HW/SW) integration phase 48. At HW/SW integration phase 48, the design engineer typically directs fabrication of a full working model of the system for final testing and possible production use.

During several portions of the development cycle, namely design and verify stage 42, fabricate and bench test phase 46, and HW/SW integration phase 48, the design engineer may determine from the various simulations performed at these stages, that the program requirements 28 or preliminary system requirements 30 do not properly model the desired system. In such circumstances, control may be returned to program requirements phase 28 or preliminary system requirements phase 30 along feedback path 52. Feedback path 52 provides feedback from design and verify stage 42 to either of program requirements 28 or preliminary system requirements 30. From fabricate and bench test phase 46, control may proceed to design and verify stage 42, program requirements phase 28 or preliminary system requirements 30. Similarly, control may return from HW/SW integration phase 48 to any of fabricate and bench test phase 46, design and verify stage 42, program requirements stage 28, and/or preliminary system requirements 30.

The development system described in FIG. 2 is particularly inventive in light of its novel use of a system-wide function-based design methodology. More particularly, the function-based methodology described herein finds novelty in the use of CAR tool 32. The collective design infobases 36 managed by database manager 34 stores many functions from which the system engineer can select to meet the preliminary system requirements 30 provided by the design engineer. These functions and implementations are then automatically assembled in reused design database 40. The function-based design methodology enables the system designer to design systems by conceptualizing and implementing functions and the result, rather than the actual details of how each function operates. By specifying in preliminary system requirements 30 several functions and linking the functions with CAR tool 32 to meet the preliminary system requirements 30, the design process becomes significantly more efficient.

Figure 3:
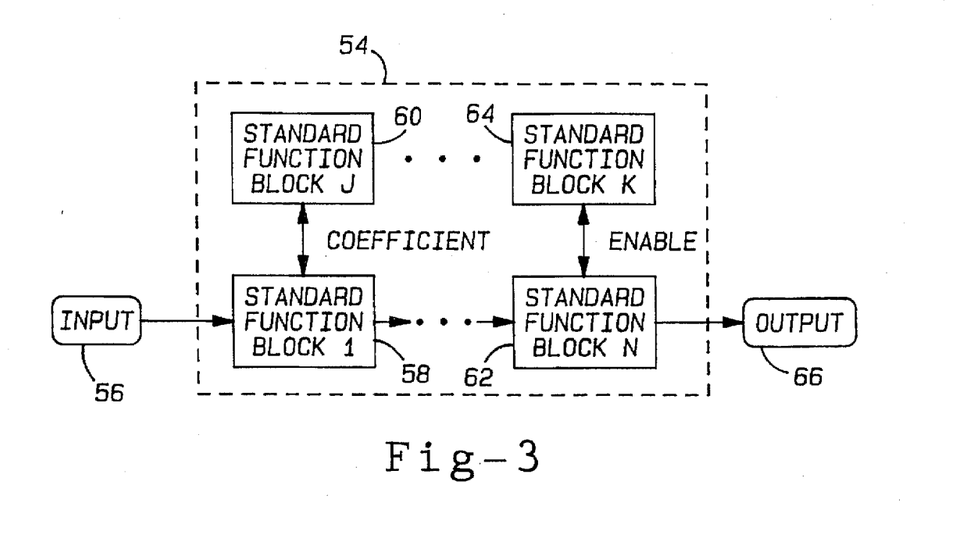
FIG. 3 is a block diagram of an exemplary interaction defined by the computer aided reuse tool between functions which combine to operate in a predetermined manner to effect the desired system.

Referring to FIG. 3, FIG. 3 depicts an exemplary block diagram of functions linked to comprise a system 54 defined by preliminary system requirements 30 of FIG. 1. One or several inputs 56 is input to the system 54. In this particular example, the inputs 56 are inputs to standard function block 1 (58) which performs predetermined operations on input 56. Also input to standard function block 1 (58) is a coefficient which is output by standard function block J (60). Standard function block J (60) may optionally receive input from standard function block 1 (58) and operate on that input to return the coefficient. The output from standard function block i (58) may be input to one of several other functions, one of which may be standard function block N (62). Standard function block N (62) receives input from standard function block 1 (58) and operates on that input to provide one or several outputs 66. Also input to standard function block N (62) is an enable flag output by standard function block K (64). Standard function block K (64) optionally receives input from standard function block N (62) or any of a number of other standard function blocks of system 54 and generates the appropriately set enable flag. Standard function block K (64) operates on the input in order to determine whether to generate an enable flag for output to standard function block N (62). Note that each of the standard function blocks 58, 60, 62, and/or 64 are designated block 1, block J, block N, block K, respectively, in order to demonstrate the generic nature of each of the function blocks may operate to perform different functions. For example, standard function block J (60) outputs a coefficient value to standard function block 1 (58). On the other hand, standard function block K (64) outputs an enable flag to standard function block N (62). An ellipse appears between standard function block 1 (58) and standard function block N (62) and also between standard function block J (60) and standard function block K (64) to signify that other functions may be included in the system 54 to satisfy the preliminary system requirements determined by the system engineer. System 54 operates to generate an output 66 which may be one or several values or an electrical signal, as will be understood by one skilled in the art.

Figure 4:
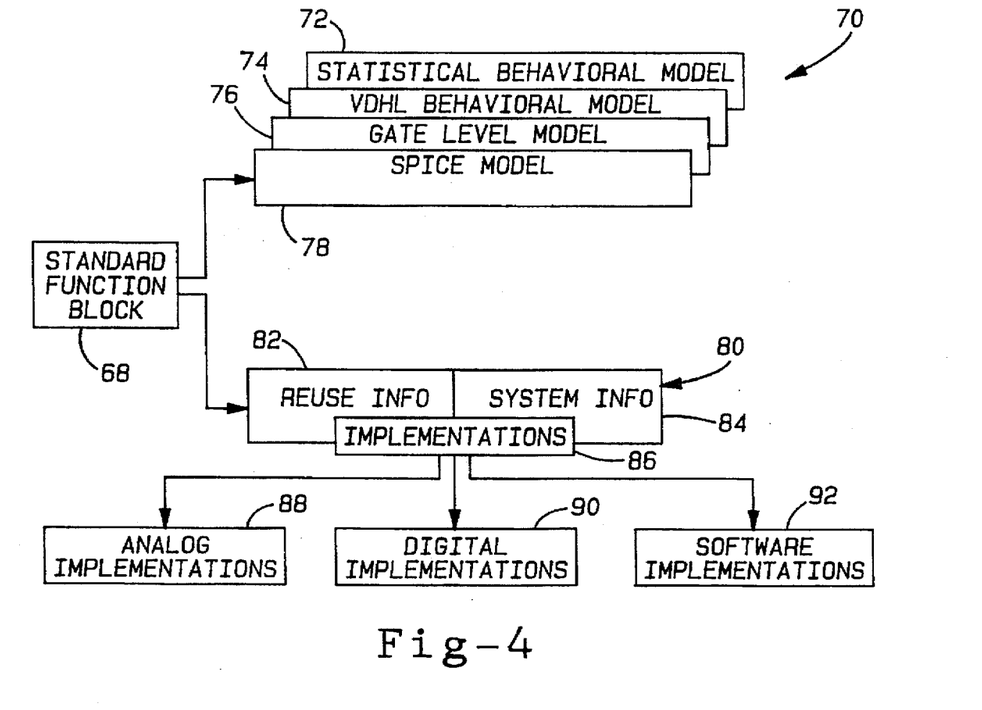
FIG. 4 is an expanded block diagram of an exemplary standard design block, which represents any one of the standard design blocks depicted in FIG. 3.

Referring to FIG. 4, an expanded block diagram of an exemplary standard function block 68 is shown. Of particular novelty with respect to this invention, standard function block 68 includes two primary components. The first primary component comprises a modeling block 70. Assume for example that the standard design modeled by standard function block 68 is an electronic circuit. Modeling block 70 includes various behavioral models of the circuit operation or design. In this particular example, modeling block 70 includes a statistical behavioral model 72, a VHDL behavioral model 74, a gate level model 76, and a SPICE model 78. Note that each of the particular models 72-78 provide various levels of abstraction in defining the function represented by standard function block 68. For example, SPICE model 78 is a component-level model of the operation of the function represented by standard function block 68. The component level model of the operation of the electronic circuit is defined and modeled within the SPICE language. On the other hand, VHDL behavioral model 74 provides a more abstract description of the function carried out by standard function block 68. The VHDL behavioral model 74 enables the system designer to view operation of the function at the more abstract input/output level, rather than the more detailed gate level model 76 or component level model SPICE model 78.

The second component of standard block 68 is embodied in implementation block 80. The implementation block 80 may be further subdivided into two information sections, each providing information related to different aspects of individual implementations. A reuse information section 80 typically includes information related to parameters and ranges for the specified design. That is, the design may be modeled for purposes of initial design and verification (as shown in design and verification phase 42 of FIG. 2) using a selected model of modeling block 70 which has had parameter values appropriately selected for the application. Such modeling is sufficient for testing the functionality of the system under design. These same parameter selections, are, however, automatically reflected in the implementations. The reuse information 82 may be then incorporated at a more advanced testing stage, after the functionality of the system under design has been better determined. A second information section, system information section 84, may address the system related configurations. For example, assuming the standard function block 68 represents a circuit, system information 80 would store system-related information on the circuit such as speed, accuracy, power consumption, radiation tolerances, and form functions.

Figure 5:
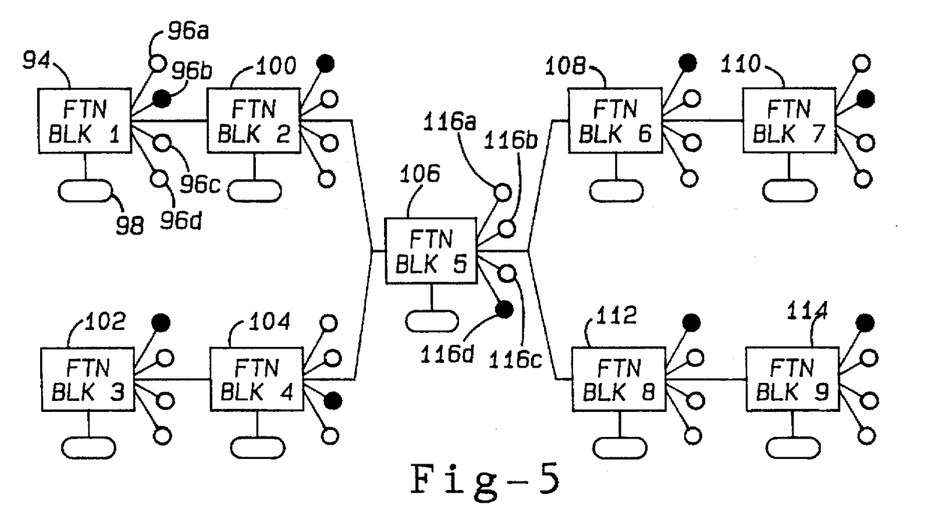
FIG. 5 is a block diagram of a system comprised of a plurality of function blocks arranged by the computer aided reuse tool to interact in a predetermined manner to comprise the desired system, where the function blocks interact in a predetermined manner in accordance with a predefined system defined by the design engineer.

The reuse information 82 and system information 84 are used to differentiate and select specific implementations 86. For example, assuming that standard function block 68 performs a filtering function, standard function block 68 stores at implementations block 86 a number of possible implementations. For example, the filter function of standard function block 68 may have several implementations. These implementations include analog implementations 88 (an analog circuit), digital implementations 90 (a digital circuit), and/or software implementations 92 (a software filter). The particular implementation selected to carry out the function represented by standard function block 68 depends in great part on the reuse information 82 (parameters and ranges for the filter function) and system information 84 (such as speed, accuracy, power consumption, etc.). Standard function block 68 stored by CAR tool 32 is assembled in a modular format as can be seen with reference to function block 1(94) of FIG. 5. For example, assuming that function block 1 of FIG. 5 represents the standard function block 68 of FIG. 4. The circular outputs 96a, 96b, 96c, and 96d, each represent one of the behavioral models from modeling block 70 of standard function block 68. For example, circular output 96a may be associated with statistical behavioral model 72, circular output 96b may be associated with VHDL behavioral model 74, circular output 96c may be associated with gate level model 76, and circular output 96d may be associated with SPICE model 78. Similarly, implementation section 80 from standard function block 68 is represented in function block 1 (94) of FIG. 5 using ovular output 98. Note that this convention provides an iconic representation of the standard function block 68 of FIG. 4 to facilitate describing the system under design. It will be understood by one skilled in the art that as the number of models comprising modeling block 70 shown in FIG. 4 may vary, so may the circular outputs representing each model vary in FIG. 5.

Also shown in FIG. 5 are function block 1 through function block 9, 94-114, respectively. The function blocks depicted in FIG. 5 are linked in order to demonstrate the interaction between the plurality of functions comprising the system. FIG. 5 graphically illustrates not only the interaction between the plurality of function blocks, FIG. 5 also illustrates that the system designer may select one of a plurality of models to represent the associated function during the design and verification phase 42 (of FIG. 2). For example, referring to function block 1, and assuming that function block 1 is analogous to function block 68 as described above, the darkened circular output 96b indicates that the system designer has selected that particular model to model operation of function block 1(94). By analogy to standard function block 68, the system designer has selected VHDL behavioral model 74 to model the function provided by function block 1(94). Similarly, referring to function block 5 (106), assume that function block 5 (106) may be modeled in one of four different ways, demonstrated by circular outputs 116a, 116b, 116c and 116d. In this particular example, the system designer has selected model 116c in order to model the function effected by function block 5 (106). This provides the system designer with enhanced flexibility in modeling the system, as each model affords a varying level of abstraction. Therefore, for those functions which the operator need not view in detail, a more abstract model of the function may be selected. Similarly, where the system designer requires significant detail in modeling the system, the operator may select the more complex model to represent the function carried out by a particular function block.

Figure 6:
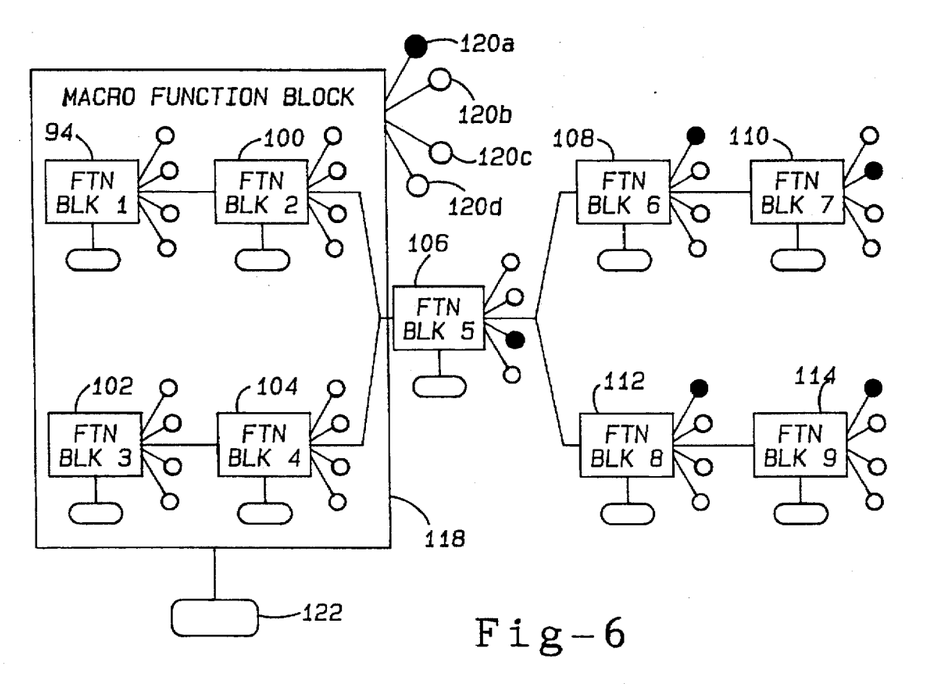
FIG. 6 is one possible grouping of the functions depicted in FIG. 5 and demonstrates one possible grouping of a number of function blocks depicted in FIG. 5 to define a macro function.

FIG. 6 demonstrates yet another future of this invention. FIG. 5 includes function blocks 1 through function blocks 9 (94-114), which are arranged similarly as depicted in FIG. 5. In addition, several function blocks are grouped to define a macro function block 118. Macro function block 118 provides a singular output resulting from the operation of function blocks 1 through 4 (94-104). In this manner, if function blocks 1 through 4 (94-104) are continually grouped to provide the same function, they may be summarily blocked in design infobase 36 so that the function that they perform may be recalled without having to individually link or test each of function blocks 1 through 4. Macro function block 118 is similarly structured to other function blocks in that macro function block includes circular outputs 120a, 120b, 120c, and 120d, which are similarly as described with respect to circular outputs 96a-96d of FIG. 5. In this manner, the operation of macro function block 118 may be similarly modeled at different levels of abstraction with the proper selection of circular outputs 120a–120d as models. Also, macro function block includes ovular output 122 representing implementation related data as described above.

Figure 7:
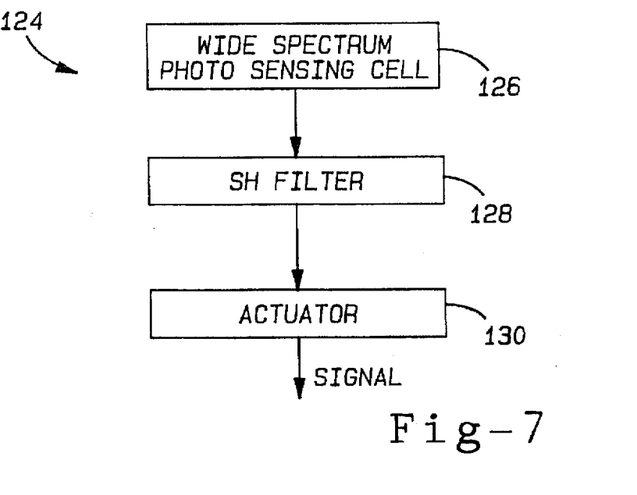
FIG. 7 is a block diagram of primitive and macro functions arranged to define an optical actuator.

FIG. 7 provides a specific example of the grouping of individual functions in order to create a macro function, as shown in FIG. 6, which may simplify the development process. FIG. 7 depicts a block diagram of an optical actuator 124. The block diagram includes a wide spectrum photo-sensing cell 126 which may be modeled as a function and stored in design infobase 36. Similarly, SH-filter 128 is a selective harmonic filter, which may also be modeled as a function and stored in design infobase 36. Finally, actuator 130 may also be modeled as a function and stored in design infobase 36. The three individual functions of the optical actuator 124 are then combined as shown in FIG. 7 to output a signal, in accordance with the output of actuator 130. Note however that SH-filter 128 is actually a combination of functions as depicted in FIG. 8.

Figure 8:
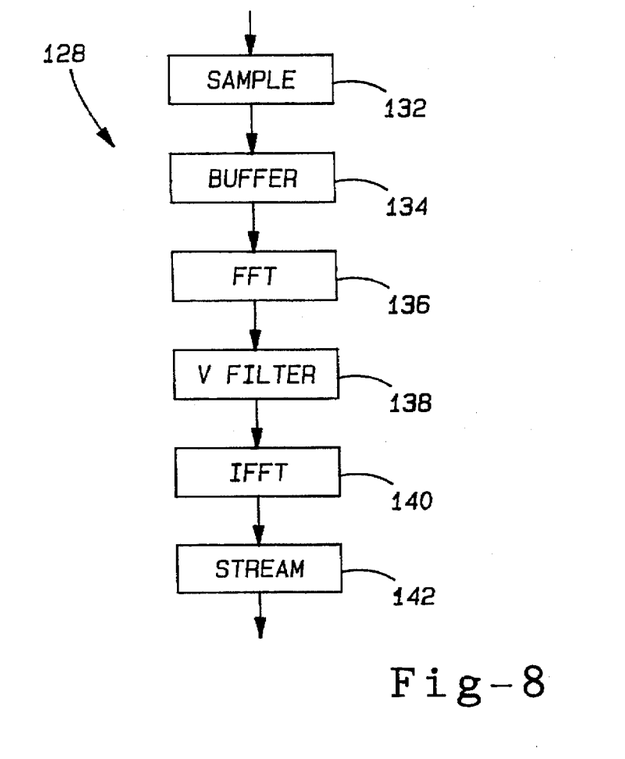
FIG. 8 is a block diagram of the several functions shown in FIG. 7, where the macro function is decomposed into its component primitive functions.

In FIG. 8, SH-filter 126 is divided into six functions, each yielding a different function. Sample function 132 samples the input from photosensing cell 126 and digitizes the incoming sample if the input is in analog format. Buffer 134 stores the value of the digitized parameter determined by sample 132. Buffer 134 then outputs the value to Fast Fourier Transform (FFT) 136 which receives the digitized values and produces frequency coefficients which model the input received by photosensing cell 126. The coefficients are output to V-filter (video filter) 138 which weights the coefficients in order to eliminate unwanted frequencies and then outputs the weighted coefficients to Inverse FFT (IFFT) 140. The IFFT produces a vector comprising only the desired frequencies received by photosensing cell 126. Stream function 142 receives the vector output by IFFT function 140 and produces a serial stream to operate actuator 130. Note that while selective harmonic filter 128 is a macro incorporating each of the functions described in FIG. 8, selective harmonic filter 128 could be modeled as the individual functions depicted in FIG. 8. However, because selective harmonic filter 128 is a commonly used filter by systems engineers, it may be more efficiently modeled as a macro as shown in SH-filter 128.

FIGS. 7 and 8 also provide an example of the difference between a primitive function and ensemble function. A primitive function is described as a list of user-specifiable operations that contain no sub-elements. Primitives are wholly self-contained functions. All of the function blocks of FIG. 8 are considered primitives in this particular example. However, it will be understood by one skilled in the art that primitive functions are defined by the user, and that any of the blocks of FIG. 8 could be configured to rely on sub-functions. In such a case, the function blocks of FIG. 8 would no longer be considered primitives. An ensemble, on the other hand, is an interconnection of other ensembles and primitives. Both ensembles and primitives can have one or several models (as shown in FIGS. 4 and 5) and implementations. The same functionality may be described using a primitive or an ensemble. Whether to select a particular function as a primitive or ensemble is a user choice which depends primarily on the particular usage the user foresees for that function and how the function will be manipulated. While it may be simpler to deal with primitive descriptions, ensemble functions tend to be easier to modify.

Figure 9:
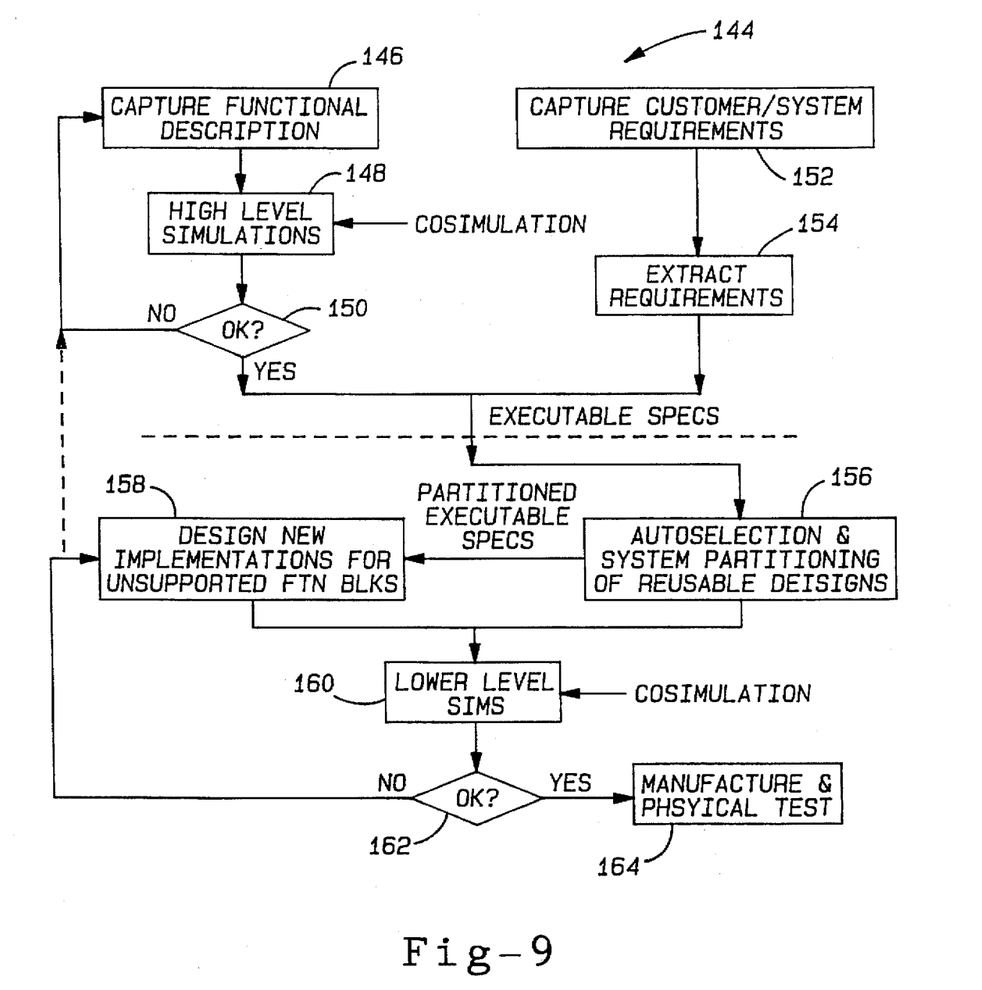
FIG. 9 is a flow diagram depicting in detail the design methodology applied in utilizing the computer aided reuse tool in accordance with the principals of the present invention.

FIG. 9 depicts a detailed block diagram of the design process in which the functional and the system requirements are separated in order to facilitate the design process. The flow diagram depicted in FIG. 10 is similar to that depicted in FIG. 2, except that the flow diagram depicted in FIG. 10 more directly addresses the relationship between functional description and system requirements. In flow diagram 144, the system engineer initially determines two sets of requirements. The first set of requirements addresses the functional description and is depicted at block 146 in which a system designer determines the functional operation of the system at capture functional description block 146. After the functional description has been captured, the system designer may perform high level simulations as shown at block 148. The high level simulations may typically include co-simulations which support the high level simulations. At block 150 a test is performed to determine if the high level simulations accurately capture the functional description. If the high level simulations do not accurately capture the functional description, the design engineer again attempts to capture the functional description as shown at block 146. If the high level simulation demonstrates an acceptable functional description, control then proceeds and executable specifications are then generated. In addition to capturing the function descriptions, system designers also must capture customer/system requirements as shown at block 152. After the customer/system requirements have been determined, the customer/system requirements are extracted and organized as shown in block 154. Next, executable specifications for the functional description and the system requirements are then generated. After the executable specifications are generated, the CAR tool 32 then searches the design infobase 36 using database manager 34 in order to auto select reusable design implementations from design infobase 36, as shown at auto selection block 156. In order to perform auto selection at block 156, the CAR tool 32 partitions system constraints such as speed, power and weight over functional elements which capture the functional requirements. If the car tool 32 does not locate a suitable design meeting the functional requirements, new implementations for the unsupported function blocks are designed as shown at block 158. Low level simulations are performed on the functions selected by the CAR tool 32 and those designed by the system designer at block 158. As shown in block 162, if the low level simulations are acceptable to the system designer, the functions provided by the CAR tool 32 are then manufactured and physically tested to insure proper operation.

It can be seen from the above that a primary advantage of the design methodology described above lies in the separation of the function being carried out from the system related constraints associated with a function. When system designers use this methodology, they are at liberty to repeatedly test the functionality of systems without directly addressing the implementation limits and overall system requirements. Several advantages result. First, previously designed elements may be leveraged by reuse and modeling as high level building blocks in the development of new designs. Second, because the tool reuses existing design elements, critical partitioning parameters such as memory requirements for software executable and gate counts for synthesizeable hardware descriptions will already be known fairly accurately. This information will facilitate reuse of such design by the reuse tool to incorporate automatic sub-system wide function partitioning.

Although the invention has been described with particular reference to certain preferred embodiments thereof, variations and modifications can be effected within the spirit and scope of the following claims.

What is claim is:

1. A programmable machine system for designing a predefined target system by combining a plurality of selected functions to define the target system, the target system including a functional description and system constraints, the machine system including a plurality of system components, the machine comprising:

first means for storing a plurality of designs for carrying out specified operations, each design being executable in at least one implementation, and a selected one design of the plurality is combinable with a selected other design of the plurality to yield a predetermined result;

second means for combining selected designs of the plurality to substantially satisfy the functional description of the preselected target system; and third means for automatically selecting for reuse particular implementations of each design of the combined designs such that the system constraints are partitioned over the selected implementations to substantially satisfy the constraints for the entire target system.

2. The system of claim 1 further comprising a memory for storing the plurality of designs, the memory storing for each design both functional requirements and system constraints which define each design.

3. The system of claim 1 wherein a user directs the second means in combining selected designs to substantially satisfy the functional description of the target system.

4. The system of claim 1 wherein the third means for selecting particular implementations retrieves the particular implementations from a memory, the memory being associated with the first means and stores therein for each design at least one implementation and system constraint.

5. The system of claim 1 further comprising a fourth means operable by a user to select from memory particular designs, the designs being combinable to substantially satisfy the functional requirements of the target system.

6. The system of claim 5 wherein the fourth means includes a simulator for simulating the operation of the selected, combined designs to determine if the combined designs satisfy the functional requirements of the target system.

7. The system of claim 6 wherein the simulator of the fourth means further simulates the operation of the selected implementations to determine if the selected implementations of the combined designs satisfies the system constraints of the target system.

8. The system of claim 1 further comprising a means for generating a design, the design being generated by a user and carrying out operations specified by the user.

9. The system of claim 8 further comprising a means for storing the generated designs in a memory, the memory being accessible by the first, second, and the third means in order to make the generated designs available for selection and combination with designs already stored in memory by the first means.

10. The system of claim 1 further comprising a fifth means for outputting the target system to an apparatus for manufacturing the target system.

11. A method for designing a predefined target system by combining a plurality of selected functions to define the target system, the target system including a functional description and system constraints, the method comprising the steps of:

storing a plurality of designs for carrying out specified operations, each design being executable in at least one implementation, and a selected one design of the plurality is combinable with a selected other design of the plurality to yield a predetermined result;

combining selected designs of the plurality to substantially satisfy the functional description of the preselected target system; and automatically selecting for reuse particular implementations of each design of the combined designs such that the system constraints are partitioned over the selected implementations to substantially satisfy the constraints for the entire target system.

12. The method of claim 11 further comprising the step of storing the plurality of designs, and storing for each design both functional requirements and system constraints which define each design.

13. The method of claim 11 wherein the step of selecting particular implementations further comprises the step of retrieving the particular implementations from a memory.

14. The method of claim 11 further comprising the step of selecting particular designs from memory, the designs being combinable to substantially satisfy the functional requirements of the target system.

15. The method of claim 14 further comprising the step of simulating the operation of the selected, combined designs to determine if the combined designs satisfy the functional requirements of the target system.

16. The method of claim 11 further comprising the step of simulating the operation of the selected implementations to determine if the selected implementations of the combined designs satisfies the system constraints of the target system.

17. The method of claim 11 further comprising the step of generating a design, the design being generated by a user, and carrying out operations specified by the user.

18. The method of claim 17 further comprising the step of storing the generated designs in a memory in order to provide generated designs available for selection and combination with designs already stored in memory by the first means.

19. The method of claim 11 further comprising the step of outputting the target system to an apparatus for manufacturing the target system.

20. A programmable machine system for designing a predefined target system by combining a plurality of selected functions to define the target system, the target system including a functional description and system constraints, the machine system including a plurality of system components, the machine comprising:

first means for storing a plurality of designs for carrying out specified operations, each design being executable in at least one implementation, and a selected one design of the plurality is combinable with a selected other design of the plurality to yield a predetermined result, the first means including a memory storing for each design both functional requirements and system constraints which define each design;

second means for combining selected designs of the plurality stored in memory to substantially satisfy the functional description of the preselected target system;

third means for automatically selecting from memory for reuse particular implementations of each design of the combined designs such that the system constraints are partitioned over the selected implementations to substantially satisfy the constraints for the entire target system;

a simulator for simulating the operation of the selected, combined designs to determine if the combined designs satisfy the functional requirements of the target system; and a means for generating and storing for reuse a new design, the new design being generated by a user and carrying out operations specified by the user.

* * * * *